(12) United States Patent
Joo et al.

(10) Patent No.: US 8,070,546 B2
(45) Date of Patent: Dec. 6, 2011

(54) LASER IRRADIATION APPARATUS FOR BONDING AND METHOD OF MANUFACTURING DISPLAY DEVICE USING THE SAME

(75) Inventors: Young-Cheol Joo, Yongin (KR);
Kwan-Hee Lee, Yongin (KR);
Seung-Yong Song, Yongin (KR);
Young-Seo Choi, Yongin (KR);
Sun-Young Jung, Yongin (KR);
Oh-June Kwon, Yongin (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/662,363

(22) Filed: Apr. 13, 2010

(65) Prior Publication Data
US 2010/0279577 A1    Nov. 4, 2010

(30) Foreign Application Priority Data
Apr. 30, 2009    (KR) .................. 10-2009-0038453

(51) Int. Cl.
*H01J 9/00*    (2006.01)
(52) U.S. Cl. ....................................................... 445/25
(58) Field of Classification Search .............. 445/23–25
See application file for complete search history.

(56) References Cited

U.S. PATENT DOCUMENTS

| | | |
|---|---|---|
| 2004/0040655 A1 | 3/2004 | Yuasa |
| 2007/0004232 A1 | 1/2007 | Shareef et al. |
| 2008/0295769 A1 | 12/2008 | Kawagoe et al. |

FOREIGN PATENT DOCUMENTS

| | | |
|---|---|---|
| DE | 10235234 B3 | 1/2004 |
| EP | 1925601 A1 | 5/2008 |
| KR | 10-2007-0083148 A | 8/2007 |
| KR | 10-0850808 B1 | 8/2008 |
| KR | 10-2008-0111959 A | 12/2008 |

OTHER PUBLICATIONS

Office Action issued in corresponding Korean application, 10-2009-0038453, dated Jun. 22, 2011.

*Primary Examiner* — Joseph L Williams
(74) *Attorney, Agent, or Firm* — Lee & Morse, P.C.

(57) ABSTRACT

A laser irradiation apparatus for bonding a first substrate to a second substrate using bonding members and a method of manufacturing a display device using the same, the laser irradiation apparatus including a stage on which the first substrate is mounted, bonding members disposed between the first substrate and the second substrate, a laser oscillating member configured to irradiate a laser beam onto the bonding members, and a temperature maintaining member co-operating with the first substrate to maintain a temperature of the first substrate at a predetermined temperature.

16 Claims, 4 Drawing Sheets

LASER IRRADIATION APPARATUS FOR BONDING AND METHOD OF MANUFACTURING DISPLAY DEVICE USING THE SAME

BACKGROUND

1. Field

Embodiments relate to a laser irradiation apparatus and a method of manufacturing a display device using the same.

2. Description of the Related Art

In recent years, display devices have expanded to include portable thin flat panel display devices. Among flat panel display devices, electroluminescent display devices, which are self-emitting display devices, may have advantages, e.g., a wide viewing angle, a good contrast, and a rapid response speed. Thus, such display devices have been spotlighted as next generation display devices. In particular, organic light-emitting display devices including a light-emitting layer formed of an organic material may exhibit better, e.g., brightness, driving voltage, and response speed characteristics than inorganic light-emitting display apparatuses and may provide multicolored images.

In general, an organic light emitting display device may include a first electrode, a second electrode, and one or more organic layers that include a light emitting layer. Such organic layers may be interposed between the first electrode and the second electrode. The first electrode may be disposed on a substrate and may act as an anode. The one or more organic layers may be disposed on the first electrode. The second electrode facing the first electrode may act as a cathode emitting electrons and may be disposed on the one or more organic layers.

Because the first electrode and the second electrode may be susceptible to oxidation and exfoliation if ambient moisture or oxygen is introduced into the organic light emitting display apparatus, life span of the organic light emitting display apparatus may be shortened, luminous efficiency may be reduced, and quality of color reproduction may deteriorate. Accordingly, when an organic light emitting display apparatus is manufactured, a sealing process for preventing external moisture from penetrating into the organic light emitting display apparatus may typically be performed. The sealing process may involve laminating a film formed of an organic polymer, e.g., polyethylene terephthalate (PET), onto the second electrode. Alternatively, the sealing process may involve forming a cover or a cap formed of a metal or glass including a humectant, filling nitrogen into an inner space formed by the cover or the cap, and encapsulating the cover or the cap with a sealant, e.g., epoxy.

SUMMARY

Embodiments are therefore directed to a laser irradiation apparatus and a method of manufacturing a display device using the same, which substantially overcomes one or more of the drawbacks, limitations, and/or disadvantages of the related art.

It is a feature of an embodiment to provide a laser irradiation apparatus that may minimize stress generated during laser irradiation and thus minimize cracking in a cut surface.

At least one of the above and other features and advantages may be realized by providing a laser irradiation apparatus for bonding a first substrate to a second substrate using bonding members, the laser irradiation apparatus including a stage on which the first substrate is mounted, bonding members disposed between the first substrate and the second substrate, a laser oscillating member configured to irradiate a laser beam onto the bonding members, and a temperature maintaining member co-operating with the first substrate to maintain a temperature of the first substrate at a predetermined temperature.

The temperature maintaining member may be configured to heat the first substrate to the predetermined temperature and maintain the first substrate at the predetermined temperature to reduce stress between a portion of the substrate to which the laser beam is irradiated and a portion to which the laser beam is not irradiated.

The temperature maintaining member may be configured to maintain the first substrate at the predetermined temperature while the laser beam irradiates the bonding members.

The predetermined temperature may be about 80° C. to about 100° C.

The temperature maintaining member may be disposed in the stage.

The temperature maintaining member may be disposed between the first substrate and the stage.

The temperature maintaining member may be a hot wire configured to heat the first substrate to the predetermined temperature and maintain the first substrate at the predetermined temperature.

The bonding members may be formed of fits.

The laser irradiation apparatus may further include a mask having patterns corresponding to positioning of the bonding members so that the laser beam irradiates only the bonding members.

The first substrate may include a plurality of cells each having an organic light emitting unit, the second substrate may be disposed on the first substrate to seal the plurality of cells, and the bonding members may be disposed between the first substrate and the second substrate and surround the plurality of cells.

At least one of the above and other features and advantages may also be realized by providing a method of manufacturing a flat panel display apparatus using a laser irradiation apparatus for bonding a first substrate to a second substrate using bonding members, the method including applying the bonding members to the second substrate, bonding the first substrate to the second substrate, mounting the bonded first substrate and second substrate on a stage of the laser irradiation apparatus, maintaining the first substrate and the second substrate at a predetermined temperature, and irradiating a laser beam onto the bonding members to fuse the bonding members and seal the first substrate and the second substrate.

Maintaining the first substrate and the second substrate at the predetermined temperature may include heating the first substrate and the second substrate to the predetermined temperature that does not cause degradation of light emitting units formed on the first substrate, and maintaining the first substrate and the second substrate at the predetermined temperature.

Maintaining the first substrate and the second substrate at a predetermined temperature may include maintaining the first substrate and the second substrate at a temperature of about 80° C. to about 100° C.

The bonding members may be formed of fits.

The first substrate and the second substrate may be maintained at the predetermined temperature while the laser beam irradiates the bonding members.

At least one of the above and other features and advantages may also be realized by providing a laser irradiation apparatus for bonding a first substrate to a second substrate using bonding members, the laser irradiation apparatus including a laser oscillating member configured to irradiate a laser beam onto the bonding members, a temperature maintaining member for maintaining the first substrate at a predetermined temperature, and a stage configured to accommodate the first substrate, the second substrate, and the temperature maintaining member.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
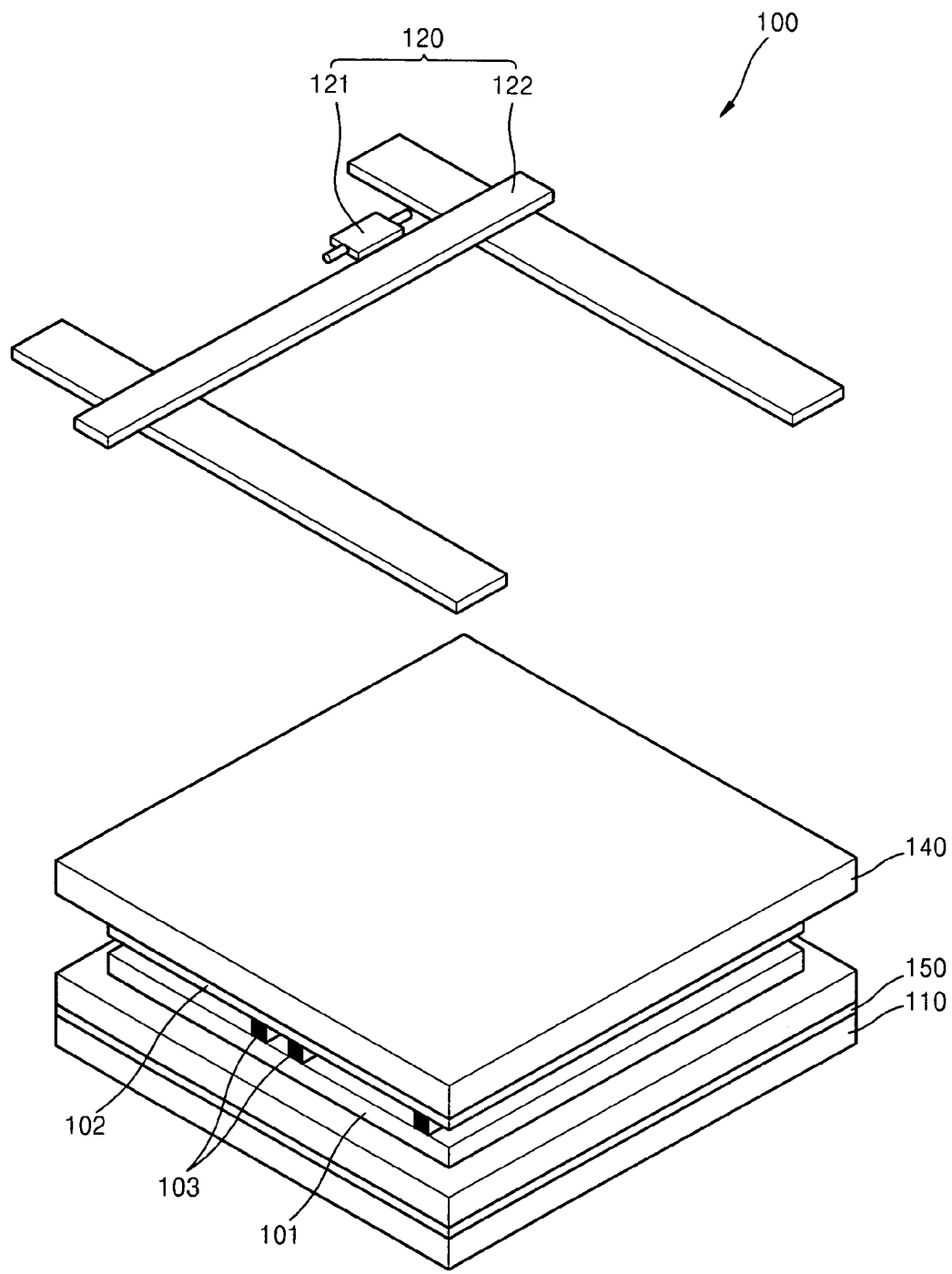
FIG. 1 illustrates a perspective view of a laser irradiation apparatus according to an embodiment.

Korean Patent Application No. 10-2009-0038453, filed on Apr. 30, 2009, in the Korean Intellectual Property Office, and entitled: "Laser Irradiation Apparatus and Method of Manufacturing Flat Panel Display Apparatus Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
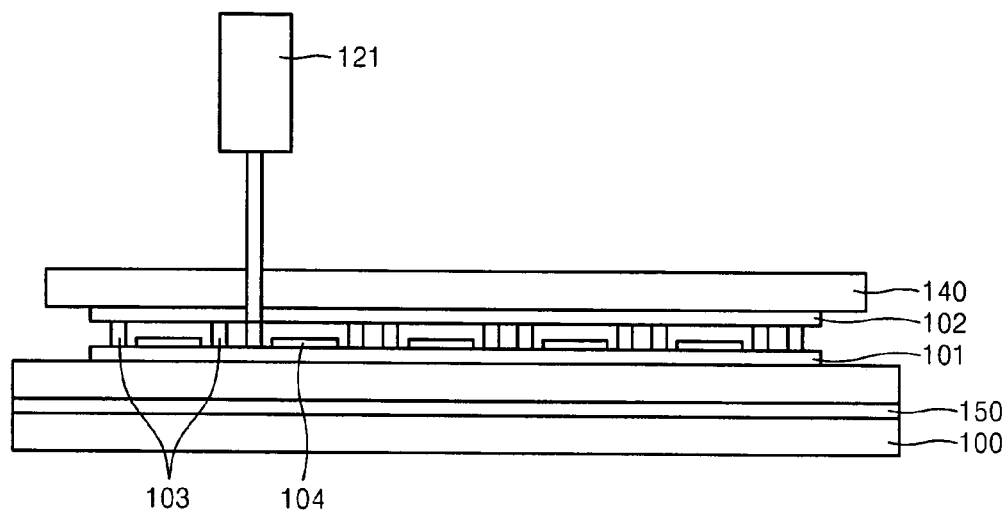
FIG. 2 illustrates a cross-sectional view of the laser irradiation apparatus of FIG. 1.

FIG. 1 illustrates a perspective view of a laser irradiation apparatus 100 according to an embodiment. FIG. 2 illustrates a cross-sectional view of the laser irradiation apparatus 100 of FIG. 1. Referring to FIGS. 1 and 2, the laser irradiation apparatus 100 may include a stage 110, a laser oscillating member 120, a mask 140, and a temperature maintaining member 150.

A first substrate 101 and a second substrate 102 may be mounted on the stage 110. While a laser beam is irradiated, the stage 110 may fixedly support the first substrate 101 and the second substrate 102. Bonding members 103 may be disposed between the first substrate 101 and the second substrate 102.

The laser oscillating member 120 may irradiate the laser beam onto the bonding members 103 between the first substrate 101 and the second substrate 102 to fuse the bonding members 103 to the first substrate 101 and the second substrate 102. The laser oscillating member 120 may include a laser head 121 and a laser head guide 122. The laser head 121 may be supported by the laser head guide 122, and may be movably mounted above the first substrate 101 and the second substrate 102. The laser head 121 may irradiate the laser beam onto the bonding members 103 and may be simultaneously moved along the laser head guide 122 above the first and second substrates 101 and 102.

The mask 140 may be mounted on a top surface of the second substrate 102. The mask 140 may have patterns corresponding to the bonding members 103, so that the laser beam from the laser head 121 may irradiate only onto the bonding members 103 and may be blocked from irradiating light emitting units 104.

The bonding members 103, which may be disposed between the first substrate 101 and the second substrate 102, may be fused to the first substrate 101 and the second substrate 102 by the laser beam from the laser head 121. Thus, the first substrate 101 and the second substrate 102 may be bonded together. The bonding members 103 may be formed of frits. Although the term fit may refer to powdered glass in a general sense, it may broadly mean, e.g., a jelly-like glass including an organic material and/or a solid glass hardened by an irradiated laser beam.

The temperature maintaining member 150 may maintain the first substrate 101 and the second substrate 102 at a predetermined temperature. The temperature maintaining member 150 may heat the first substrate 101 and the second substrate 102 to the predetermined temperature before the laser beam is irradiated thereon. The temperature maintaining member 150 may also maintain the first substrate 101 and the second substrate 102 at the predetermined temperature while the laser beam is irradiated thereon. Alternatively, the temperature maintaining member 150 may heat and maintain the first substrate 101 and the second substrate 102 at the predetermined temperature at the same time the laser beam is irradiated thereon.

Stress in the frits and the first and second substrates 101 and 102 may be advantageously reduced due to the temperature maintaining member 150 maintaining the first and second substrates 101 and 102 at the predetermined temperature while the laser beam irradiated by the laser head 121 is irradiated thereon. With respect to the matter of stress, when the laser beam irradiates the bonding members 103, the bonding members 103, e.g., fits, may be heated to about 800° C. to about 1000° C. Since the laser beam may be concentrated on the bonding members 103, and may be blocked by the mask 140 from irradiating the light emitting units 104, the light emitting units 104 may be unaffected by the laser beam. However, stress may be generated between portions of the substrates 101 and 102 to which the laser beam is irradiated and portions of the substrates 101 and 102 to which the laser beam is not irradiated, and thus undesirable cracking may occur in cut surfaces when the substrates 101 and 102 are beveled. Stress may be generated because the portions of the substrates 101 and 102 to which the laser beam is irradiated (i.e., irradiated portions) may be heated to a high temperature and the portions of the substrates 101 and 102 to which the laser beam is not irradiated (i.e., un-irradiated portions) may not be heated, and thus, there may be a temperature difference between the portions of the substrates 101 and 102.

The temperature maintaining member 150, however, may beneficially minimize stress generation between irradiated portions of the substrates 101 and 102 and un-irradiated portions of the substrates 101 and 102 by heating and maintaining the substrates 101 and 102 at a predetermined temperature while the laser beam is irradiated.

Figure 3:
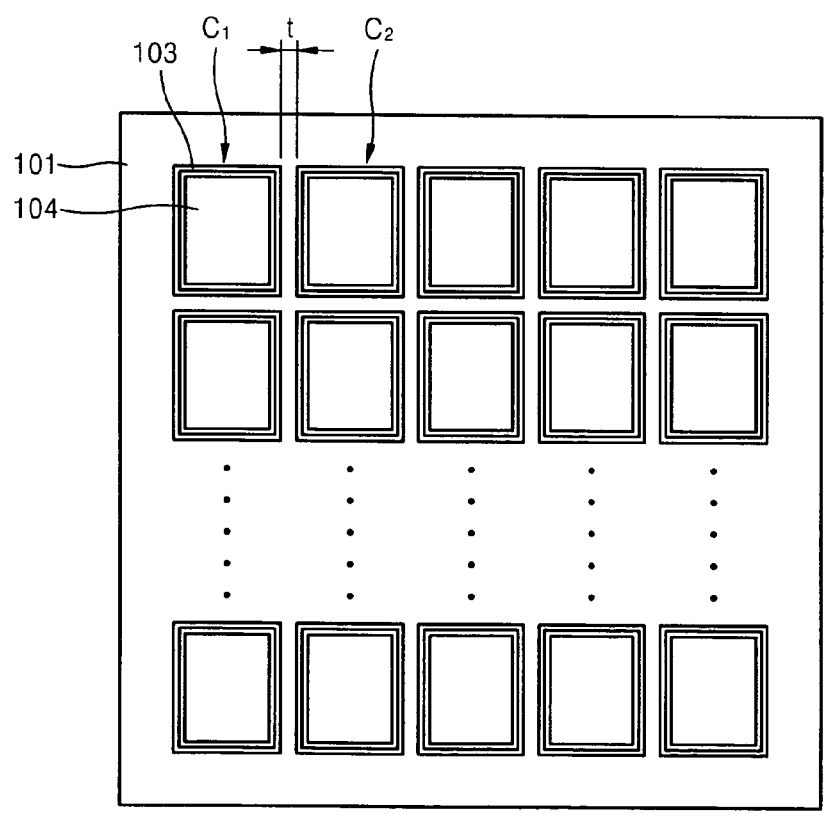
FIG. 3 illustrates a plan view of a first substrate of the laser irradiation apparatus of FIG. 1.

FIG. 3 illustrates a plan view of the first substrate 101 of the laser irradiation apparatus 100 of FIG. 1. Referring to FIG. 3, a plurality of cells $C_1, C_2, \ldots, C_n$ may be disposed on the first substrate 101. Each of the plurality of cells $C_1, C_2, \ldots, C_n$ may include a light emitting unit 104 and a bonding member 103 surrounding the light emitting unit 104. Once the first substrate 101 and the second substrate 102 are bonded to each other, the first substrate 101 and the second substrate 102 may be beveled into pieces corresponding to the plurality of cells $C_1, C_2, \ldots, C_n$, and each of the plurality of cells $C_1, C_2, \ldots, C_n$ may be used as, e.g., a flat panel display device.

The laser beam may be irradiated onto the respective bonding members 103 of the plurality of cells $C_1, C_2, \ldots, C_n$. That is, the laser head 121 may irradiate the laser beam onto the bonding member 103 of the first cell $C_1$ and then may irradiate a laser beam onto the bonding member 103 of the second cell $C_2$ adjacent to the first cell $C_1$, etc.

An interval "t" between adjacent cells of the plurality of cells $C_1, C_2, \ldots, C_n$ on the first substrate 103 may be, e.g., about several millimeters to about tens of millimeters (mm). Accordingly, while the laser beam is irradiating the bonding member 103 of the first cell $C_1$, only the bonding member 103 of the first cell $C_1$ that the laser beam is irradiating may be heated to a high temperature. The bonding member 103 of the second cell $C_2$ adjacent to the first cell $C_1$ may not be heated by the laser beam. In a typical display device, stress may be generated between portions of the substrates 101 and 102 corresponding to the first cell $C_1$ that the laser beam irradiates and portions of the substrates 101 and 102 corresponding to the second cell $C_2$ that the laser beam does not irradiate. Thus, micro cracking may occur in the first substrate 101 and the second substrate 102, and a burr may occur on cut surfaces when the first substrate 101 and the second substrate 102 are beveled.

However, according to an embodiment, since the first substrate 101 and the second substrate 102 may be maintained at the predetermined temperature by the temperature maintaining member 150, even while a laser beam is irradiated thereon, a temperature difference—between the portions of the substrates 101 and 102 corresponding to the first cell $C_1$ to which the laser beam is irradiated and the portions of the substrates 101 and 102 corresponding to the second cell $C_2$ to which the laser beam is not irradiated—may be reduced. Thus, stress between the portions of the substrates 101 and 102 corresponding to the first cell $C_1$ to which the laser beam is irradiated and the portions of the substrates 101 and 102 corresponding to the second cell $C_2$ to which the laser beam is not irradiated may be reduced. As a result, cracking on cut surfaces may be reduced when the first substrate 101 and the second substrate 102 are beveled. Also, since the first substrate 101 and the second substrate 102 may be heated and maintained at the predetermined temperature, a laser annealing process subsequent to the laser beam irradiation may be omitted, thereby beneficially increasing productivity.

The temperature maintaining member 150 may heat and maintain the first substrate 101 and the second substrate 102 at a predetermined temperature that may not cause degradation of the light emitting units 104. If the cells $C_1, C_2, \ldots, C_n$ are flat panel display devices, the light emitting units 104 may be organic light emitting display devices. In this case, since the predetermined temperature that may not cause degradation of the organic light emitting display devices may be approximately 100° C., the temperature maintaining member 150 may heat and maintain the first substrate 101 and the second substrate 102 at a temperature of about 80° C. to about 100° C. When the temperature of the first substrate 101 and the second substrate 102 is maintained at about 80° C. to about 100° C., undesirable degradation of the light emitting units 104 may be prevented and cracking in the cut surfaces may be reduced.

Figure 4:
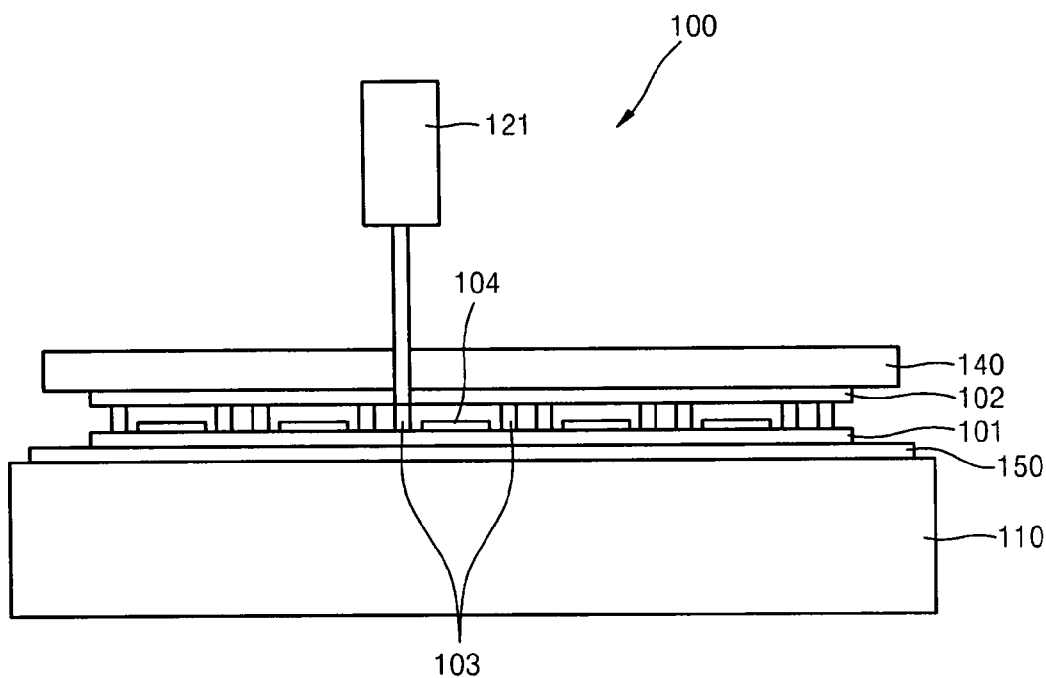
FIG. 4 illustrates a cross-sectional view of a modification to the laser irradiation apparatus of FIG. 1.

FIG. 4 illustrates a cross-sectional view of a modification to the laser irradiation apparatus 100 of FIG. 1. As illustrated in FIGS. 1 and 2, the temperature maintaining member 150 may be disposed in the stage 110. Alternatively, as illustrated in FIG. 4, the temperature maintaining member 150 may be disposed on the stage 110. Referring to FIG. 4, the first substrate 101 may be mounted on the temperature maintaining member 150. The temperature maintaining member 150 may be a hot wire that may heat and maintain the first substrate 101 and the second substrate 102 at the predetermined temperature.

A method of manufacturing a display device according to an embodiment will now be explained. The first substrate 101 and the second substrate 102 may be prepared. The light emitting units 104 may be disposed on the first substrate 101 and the bonding members 103 may be disposed on the second substrate 102.

Next, the first substrate 101 and the second substrate 102 may be bonded to each other in such a manner that the bonding members 103 may surround respective light emitting units 104.

Next, the first substrate 101 and the second substrate 102, which may be bonded to each other, may be mounted on the stage 110 of the laser irradiation apparatus 100. The stage 110 may fixedly support the first substrate 101 and the second substrate 102 while a laser beam is irradiated thereon.

Next, the first substrate 101 and the second substrate 102 may be heated to and maintained at a predetermined temperature. If the display device is an organic light emitting display device, and the light emitting units 104 are organic light emitting devices, the predetermined temperature may be about 80° C. to about 100° C. Maintaining the temperature between these amounts may help ensure that the organic light emitting devices do not degrade.

When the first substrate 101 and the second substrate 102 are heated to and maintained at the predetermined temperature, the laser beam may be irradiated onto the bonding members 103 to fuse the bonding members 103 and seal the first substrate 101 and the second substrate 102. The bonding members 103 may be formed of frits.

Figure 5:
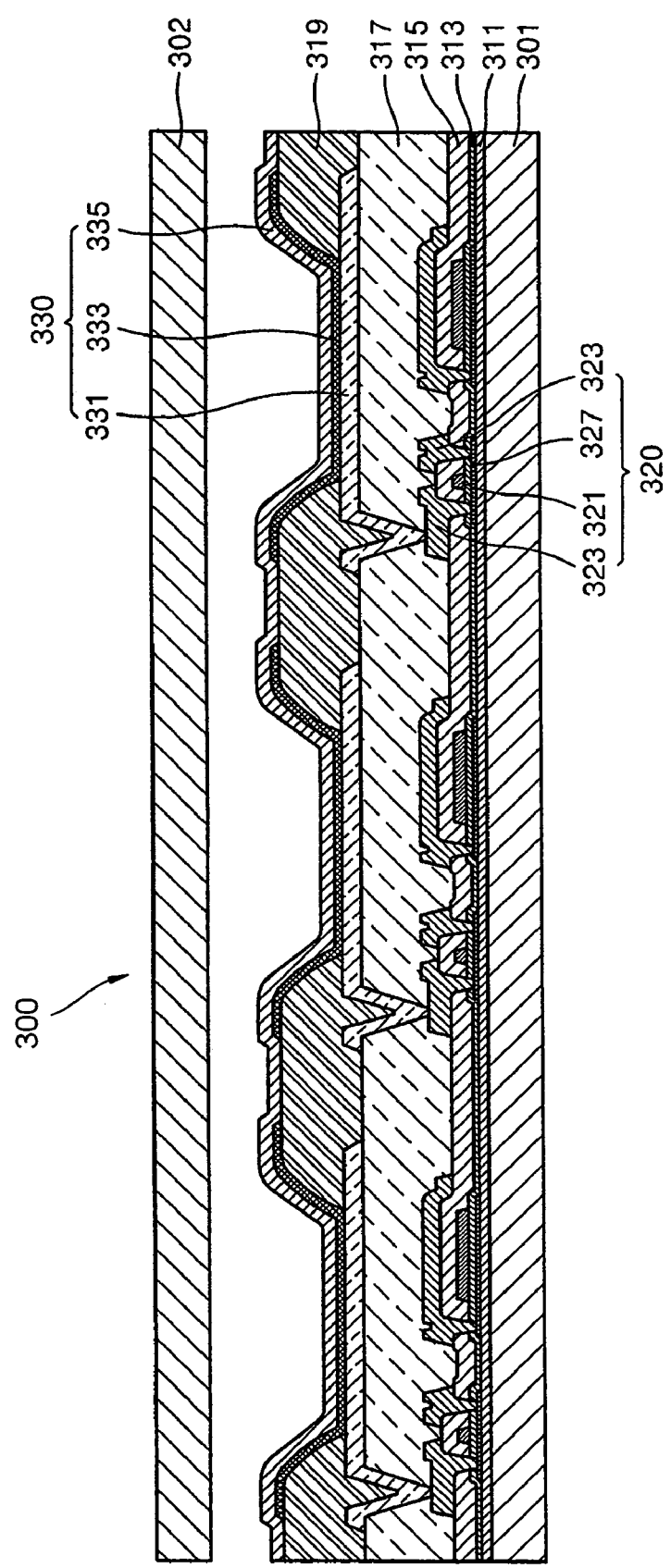
FIG. 5 illustrates a cross-sectional view of part of an organic light emitting display apparatus according to an embodiment.

FIG. 5 illustrates a cross-sectional view of part of an organic light emitting display device according to an embodiment. A detailed configuration of a light emitting unit 300 is illustrated in FIG. 5.

Referring to FIG. 5, a plurality of thin film transistors (TFTs) 320 may be disposed on a substrate 301. An organic light emitting diode 330 may be disposed on the TFTs 320. The organic light emitting diode 330 may include a pixel electrode 331 electrically connected to the TFTs 320, a counter electrode 335 disposed over an entire surface of the substrate 301, and an intermediate layer 333 disposed between the pixel electrode 331 and the counter electrode 335. The intermediate layer 333 may include a light emitting layer.

Each of the TFTs 320 may include a gate electrode 321, source and drain electrodes 323, a semiconductor layer 327, a gate insulating layer 313, and an intermediate insulating layer 315. Each of the TFTs 320 may be disposed on the substrate 301. The embodiments are not limited to the TFTs 320 illustrated in FIG. 5, and various TFTs, e.g., organic TFTs including the semiconductor layer 327 formed of an organic material and silicon TFTs formed of silicon, may be used. If desired, a buffer layer 311 formed of, e.g., silicon oxide or silicon nitride, may be further disposed between the TFTs 320 and the substrate 301.

The organic light emitting diode 330 may include the pixel electrode 331 and the counter electrode 335 facing each other. The organic light emitting diode 330 may also include the intermediate layer 333 formed of an organic material between the pixel electrode 331 and the counter electrode 335. The intermediate layer 333 including at least a light emitting layer may be formed by stacking a plurality of layers, which will be explained below.

The pixel electrode 331 may act as an anode and the counter electrode 335 may act as a cathode. However, the polarities of the pixel electrode 331 and the counter electrode 335 may be reversed.

The pixel electrode 331 may be, e.g., a transparent electrode or a reflective electrode. If the pixel electrode 331 is a transparent electrode, the pixel electrode 331 may be formed of, e.g., ITO, IZO, ZnO, or $In_2O_3$. If the pixel electrode 331 is a reflective electrode, the pixel electrode 331 may include a reflective layer formed of, e.g., Ag, Mg, Al, Pt, Pd, Au, Ni, Nd, Ir, and/or Cr, and a layer formed of, e.g., ITO, IZO, ZnO, or $In_2O_3$.

The counter electrode 335 may be a transparent electrode or a reflective electrode. If the counter electrode 335 is a transparent electrode, the counter electrode 335 may include a layer formed of, e.g., Li, Ca, LiF/Ca, LiF/Al, Al, and/or Mg, to face the intermediate layer 333 between the pixel electrode 331 and the counter electrode 335. In addition, an auxiliary electrode or a bus electrode line may be formed of a transparent electrode forming material, e.g., ITO, IZO, ZnO, or $In_2O_3$. If the counter electrode 335 is a reflective electrode, the counter electrode 335 may be formed by depositing, e.g., Li, Ca, LiF/Ca, LiF/Al, Al, and/or Mg.

A pixel defining layer (PDL) 319 may be formed to a predetermined thickness outside the pixel electrode 331 to cover a peripheral region of the pixel electrode 331. The PDL 319 may define a light emitting area, and may increase a space between the pixel electrode 331 and the counter electrode 335 to reduce an electric field in the peripheral region of the pixel electrode 331. The PDL 319 may also prevent a short circuit between the pixel electrode 331 and the counter electrode 335.

The intermediate layer 333 including at least a light emitting layer may be disposed between the pixel electrode 331 and the counter electrode 335. The intermediate layer 333 may be formed of, e.g., a low molecular organic material or a high molecular organic material.

If the intermediate layer 333 is formed of a low molecular organic material, the intermediate layer 333 may have a single-layer structure or a multi-layer structure that is formed by stacking, e.g., a hole injection layer (HIL), a hole transport layer (HTL), an organic emission layer (EML), an electron transport layer (ETL), and/or an electron injection layer (EIL). Examples of the low molecular organic material may include, e.g., copper phthalocyanine (CuPc), N,N'-di(naphthalene-1-yl)-N,N'-diphenyl-benzidine (NPB), and tris-(8-hydroxyquinoline) aluminum (Alq3). The low molecular organic materials may be formed by, e.g., vacuum deposition using masks, or the like.

If the intermediate layer 333 is formed of a high molecular organic material, the intermediate layer 333 may have a structure including, e.g., an HTL and an EML. The HTL may include, e.g., poly(3,4-ethylene-dioxythiophene) (PEDOT), and the EML may include, e.g., a (poly-phenylenevinylene) based or (polyfluorene) based high molecular organic material.

The organic light emitting diode 330 may be electrically connected to the TFTs 320 disposed under the organic light emitting diode 330. If a planarization layer 317 covering the TFTs 320 is used, the organic light emitting diode 330 may be disposed on the planarization layer 317, and the pixel electrode 331 of the organic light emitting diode 330 may be electrically connected to the TFTs 320 through contact holes formed in the planarization layer 317.

The organic light emitting diode 330 formed on the substrate 301 may be sealed by a sealing substrate 302. The sealing substrate 302 may be formed of any of various materials, e.g., glass and plastic as described above.

Since it may be impracticable to block 100% of external impurities, e.g., moisture or oxygen, by the sealing process, it may not be a good solution to use the sealing process in order to prevent external impurities from entering into a top emission active matrix organic light emitting display device that is particularly susceptible to moisture. In addition, it may actually be difficult to utilize the sealing process in the top emission active matrix organic light emitting display apparatus. Accordingly, encapsulation for improving adhesion between the substrate and the cap using frits as a sealant has been suggested.

The encapsulation may involve applying frits to the glass substrate to completely seal a space between the substrate and the cap, thereby more effectively protecting the organic light emitting display apparatus. In detail, the encapsulation may involve applying frits to sealing portions of the organic light emitting display device, and irradiating a laser beam onto the sealing portions of the organic light emitting display device by moving a laser irradiation apparatus to harden the frits.

If a laser beam is locally irradiated in order to fuse frits without affecting the surrounding environment, stress may build up between a portion to which the laser beam is irradiated and a portion to which the laser beam is not irradiated, and micro-cracks may occur in the frits and substrate. Also, when the substrate is beveled, a burr may be formed on a cut surface, and the substrate may be broken.

As described above, the laser irradiation apparatus and the method of manufacturing the flat panel display device using the laser irradiation apparatus according to an embodiment may prevent stress from being generated when a laser beam is irradiated, and thus may reduce cracking in cut surfaces.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A laser irradiation apparatus for bonding a first substrate to a second substrate using bonding members, the laser irradiation apparatus comprising:
    a stage on which the first substrate is mounted;
    bonding members disposed between the first substrate and the second substrate;
    a laser oscillating member configured to irradiate a laser beam onto the bonding members; and
    a temperature maintaining member co-operating with the first substrate to maintain a temperature of the first substrate at a predetermined temperature.

2. The laser irradiation apparatus as claimed in claim 1, wherein the temperature maintaining member is configured to heat the first substrate to the predetermined temperature and maintain the first substrate at the predetermined temperature to reduce stress between a portion of the substrate to which the laser beam is irradiated and a portion to which the laser beam is not irradiated.

3. The laser irradiation apparatus as claimed in claim 1, wherein the temperature maintaining member is configured to maintain the first substrate at the predetermined temperature while the laser beam irradiates the bonding members.

4. The laser irradiation apparatus as claimed in claim 1, wherein the predetermined temperature is about 80° C. to about 100° C.

5. The laser irradiation apparatus as claimed in claim 1, wherein the temperature maintaining member is disposed in the stage.

6. The laser irradiation apparatus as claimed in claim 1, wherein the temperature maintaining member is disposed between the first substrate and the stage.

7. The laser irradiation apparatus as claimed in claim 1, wherein the temperature maintaining member is a hot wire configured to heat the first substrate to the predetermined temperature and maintain the first substrate at the predetermined temperature.

8. The laser irradiation apparatus as claimed in claim 1, wherein the bonding members are formed of fits.

9. The laser irradiation apparatus as claimed in claim 1, further comprising a mask having patterns corresponding to positioning of the bonding members so that the laser beam irradiates only the bonding members.

10. The laser irradiation apparatus as claimed in claim 1, wherein:
the first substrate includes a plurality of cells each having an organic light emitting unit,
the second substrate is disposed on the first substrate to seal the plurality of cells, and
the bonding members are disposed between the first substrate and the second substrate and surround the plurality of cells.

11. A method of manufacturing a flat panel display apparatus using a laser irradiation apparatus for bonding a first substrate to a second substrate using bonding members, the method comprising:

applying the bonding members to the second substrate;
bonding the first substrate to the second substrate;
mounting the bonded first substrate and second substrate on a stage of the laser irradiation apparatus;
maintaining the first substrate and the second substrate at a predetermined temperature; and
irradiating a laser beam onto the bonding members to fuse the bonding members and seal the first substrate and the second substrate.

12. The method as claimed in claim 11, wherein maintaining the first substrate and the second substrate at the predetermined temperature includes:
heating the first substrate and the second substrate to the predetermined temperature that does not cause degradation of light emitting units formed on the first substrate; and
maintaining the first substrate and the second substrate at the predetermined temperature.

13. The method as claimed in claim 12, wherein maintaining the first substrate and the second substrate at a predetermined temperature includes maintaining the first substrate and the second substrate at a temperature of about 80° C. to about 100° C.

14. The method as claimed in claim 11, wherein the bonding members are formed of frits.

15. The method as claimed in claim 11, wherein the first substrate and the second substrate are maintained at the predetermined temperature while the laser beam irradiates the bonding members.

16. A laser irradiation apparatus for bonding a first substrate to a second substrate using bonding members, the laser irradiation apparatus comprising:
a laser oscillating member configured to irradiate a laser beam onto the bonding members;
a temperature maintaining member for maintaining the first substrate at a predetermined temperature; and
a stage configured to accommodate the first substrate, the second substrate, and the temperature maintaining member.

* * * * *